(12) United States Patent
Kang (10) Patent No.: US 10,942,681 B2
(45) Date of Patent: *Mar. 9, 2021

(54) MEMORY SYSTEM AND OPERATION METHOD THEREOF

(71) Applicant: SK hynix Inc., Gyeonggi-do (KR)

(72) Inventor: Min Gu Kang, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/890,396

(22) Filed: Jun. 2, 2020

(65) Prior Publication Data

US 2020/0293231 A1 Sep. 17, 2020

Related U.S. Application Data

(63) Continuation of application No. 16/155,483, filed on Oct. 9, 2018, now Pat. No. 10,671,321.

(30) Foreign Application Priority Data

Apr. 19, 2018 (KR) .......................... 10-2018-0045514

(51) Int. Cl.
*G11C 16/04* (2006.01)
*G06F 3/06* (2006.01)
*G06F 12/10* (2016.01)
*G11C 16/34* (2006.01)

(52) U.S. Cl.
CPC ............ *G06F 3/0659* (2013.01); *G06F 3/064* (2013.01); *G06F 3/0619* (2013.01); *G06F 3/0656* (2013.01); *G06F 3/0673* (2013.01); *G06F 12/10* (2013.01); *G11C 16/3427* (2013.01); *G06F 2212/657* (2013.01)

(58) Field of Classification Search
CPC ...... G06F 3/0659; G06F 3/0619; G06F 3/064; G06F 3/0656; G06F 3/0673; G06F 12/10; G06F 2212/657
See application file for complete search history.

(56) References Cited

U.S. PATENT DOCUMENTS

| 8,074,148 B2* | 12/2011 | Chu .................... G06F 11/1068 |
| | | 714/763 |
| 9,245,639 B1* | 1/2016 | Lee .................... G11C 16/0483 |
| 10,671,321 B2* | 6/2020 | Kang ................... G06F 3/0659 |
| 2019/0035473 A1* | 1/2019 | Rajamani ............ G06F 12/0246 |

* cited by examiner

*Primary Examiner* — Pho M Luu
(74) *Attorney, Agent, or Firm* — IP & T Group LLP (57) ABSTRACT

A memory system includes a storage unit configured to include a plurality of memory blocks, a controller configured to read data from the memory block and to determine disturbance risk for the memory block, and a buffer memory unit configured to store the data read from the memory block and to provide the data to a host, wherein the controller is configured to control the buffer memory unit, in which the data read from the memory block is stored, based on the disturbance risk for the memory block.

17 Claims, 8 Drawing Sheets

MEMORY SYSTEM AND OPERATION METHOD THEREOF

CROSS-REFERENCES TO RELATED APPLICATION

The present application is a continuation application of Ser. No. 16/155,483, filed on Oct. 9, 2018, which is now U.S. Pat. No. 10,671,321 issued on Jun. 2, 2020, titled "DATA STORAGE DEVICE, OPERATION METHOD FOR PREVENTING READ DISTURBANCE THEREOF, AND STORAGE SYSTEM USING THE SAME", which is incorporated herein by reference in its entirety.

BACKGROUND

1. Technical Field

Various embodiments generally relate to a semiconductor integrated circuit, and, more particularly, to a memory system and operation method thereof.

2. Related Art

A storage device is connected to a host device and performs an access operation for data at a request of the host device. Recently, portable electronic appliances which are extensively used, utilize mass storage medium in order to provide various functions which are based on multimedia data. A storage medium satisfying such a demand may include a flash memory-based storage medium.

A storage medium using a flash memory has an advantage of large capacity, nonvolatility, low cost, low power consumption, a highspeed data processing speed and the like.

However, in the flash memory, when a read operation for a specific block is repeated, since a threshold voltage level of memory cells included in the block is transitioned, stored data may be damaged. This is called a read disturbance phenomenon and causes an increase in a read error rate.

SUMMARY

In an embodiment, a memory system may include: a storage unit configured to include a plurality of memory blocks; a controller configured to read data from the memory block, and to determine disturbance risk for the memory block; and a buffer memory unit configured to store the data read from the memory block and to provide the data to a host, wherein the controller is configured to control the buffer memory unit, in which the data read from the memory block is stored, based on the disturbance risk for the memory block.

In an embodiment, an operating method of a memory system including a storage unit having a plurality of memory blocks, a controller and a buffer memory unit, may comprising: determining a disturbance risk for a memory block, when data is read from the memory block; storing the data, read from the memory block, in the buffer memory unit; controlling the buffer memory unit, in which the data is stored, based on the determination of the disturbance risk for the memory block; and copying the data, stored in the buffer memory unit, to another memory block and invalidating the memory block, when the memory block is determined as a disturbance risk block.

In an embodiment, a memory system may include: a storage unit configured to include a plurality of memory blocks; a controller configured to read data from the memory block, and to determine disturbance risk for the memory block; and a buffer memory unit configured to store the data read from the memory block and to provide the data to a host, wherein the controller is configured to control the buffer memory unit to keep the data based on the disturbance risk for the memory block.

In an embodiment, In an embodiment, an operating method of a memory system including a storage unit having a plurality of memory blocks, a controller and a buffer memory unit, may comprising: reading data from a memory block; determining a disturbance risk for the memory block; storing the data, read from the memory block, in a buffer memory unit; and determining whether releasing the buffer memory unit in which the data is stored or keeping the data in the buffer memory unit, based on the determination of the disturbance risk for the memory block.

DETAILED DESCRIPTION

Hereinafter, a data storage device, a method for preventing read disturbance thereof, and a storage system using the same will be described below with reference to the accompanying drawings through various examples of embodiments.

Figure 1:
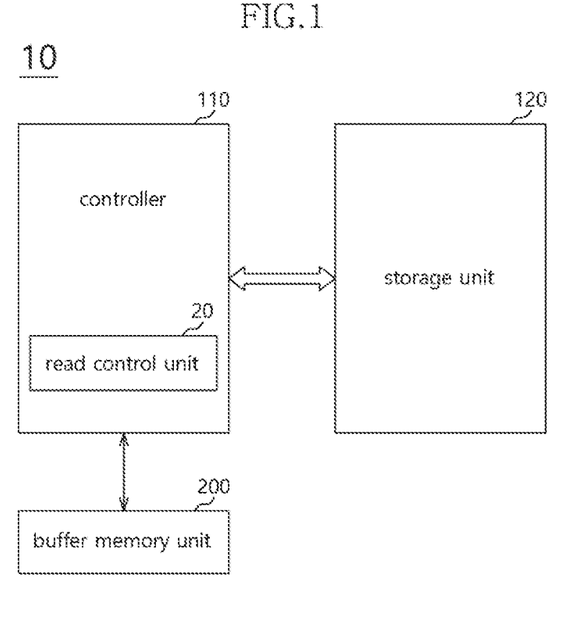
FIG. 1 is a configuration diagram of a data storage device in accordance with an embodiment.

FIG. 1 is a configuration diagram of a data storage device or a memory system in accordance with an embodiment.

Referring to FIG. 1, a data storage device 10 in accordance with an embodiment may include a controller 110 and a storage unit 120. A buffer memory unit 200 may be provided inside or outside the controller 110.

The controller 110 may control the storage unit 120 in response to a request of a host device (not illustrated in FIG. 1). For example, the controller 110 may allow data to be programmed in the storage unit 120 at a program (write) request of the host device. Furthermore, the controller 110 may read data stored in the storage unit 120 in response to a read request of the host device, and provide the read data to the host device.

The storage unit 120 may write data or output the written data under the control of the controller 110. The storage unit 120 may include a volatile or nonvolatile memory device. In an embodiment, the storage unit 120 may be implemented using a memory device selected from various nonvolatile memory devices such as an electrically erasable and programmable ROM (EEPROM), a NAND flash memory, a NOR flash memory, a phase-change RAM (PRAM), a resistive RAM (ReRAM), a ferroelectric RAM (FRAM), and a spin torque transfer magnetic RAM (STT-MRAM). The storage unit 120 may include a plurality of dies, a plurality of chips, or a plurality of packages. In addition, the storage unit 120 may include a single-level cell that stores one-bit data in one memory cell or a multi-level cell that stores multi-bit data in one memory cell.

The storage unit 120 may have a hierarchical structure including a page including a plurality of memory cells, a block including at least one page, a plane including at least one block, a die including at least one plane, and the like. Read and write (program) operations may be performed in units of pages for example, and an erase operation may be performed in units of blocks for example. In order to improve a data input/output speed, a processing unit of data to be read or written may be determined according to a manufacturing purpose and the like of the data storage device 10.

The buffer memory unit 200 serves as a space capable of temporarily storing data when the data storage device 10 inputs/outputs the data in cooperation with the host device.

In an embodiment, the controller 110 may include a read control unit 20. The read control unit 20 may determine disturbance risk for each block based on a prescribed reference when the data storage device 10 performs a read operation in response to a host command. Furthermore, the read control unit 20 may control access for read (i.e., read access) not to be performed for a block determined as a disturbance risk block. The read control unit 20 may include all circuits, systems, firmware and devices necessary for its operations and functions.

In an embodiment, the prescribed reference for determining the disturbance risk may include at least one of information on the number of times each block is read and information on an error bit number for each block.

In an embodiment, the read control unit 20 may keep data read from the block determined as the disturbance risk block in the buffer memory unit 200. When a request is provided from the host for read access for the disturbance risk block, the read control unit 20 may provide the host with the data maintained in the buffer memory unit 200 without access to the disturbance risk block.

In an embodiment, when the data storage device 10 is transitioned to an idle state, the read control unit 20 may move the data of the disturbance risk block maintained in the buffer memory unit 200 to a new block for storage.

Consequently, even when the host device repeatedly reads data of a specific block and the block is determined as the disturbance risk block, it is possible to avoid access to the block.

Figure 2:
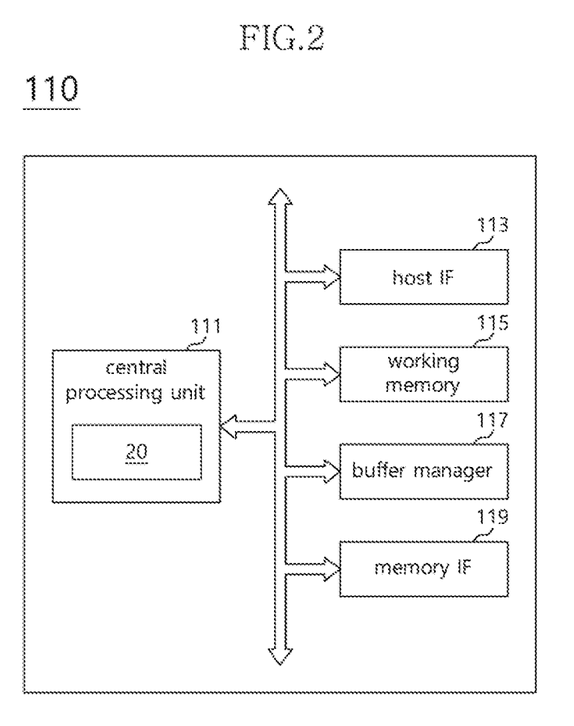
FIG. 2 is a configuration diagram of a controller in accordance with an embodiment.

FIG. 2 is a configuration diagram of the controller in accordance with an embodiment.

Referring to FIG. 2, the controller 110 in accordance with an embodiment may include a central processing unit 111, a host interface 113, an operation memory 115, a buffer manager 117, and a memory interface 119.

The central processing unit 111 may be configured to transfer various types of control information required for a data read or write operation for the read control unit 20 to the host interface 113, the operation memory 115, the buffer manager 117, and the memory interface 119. In an embodiment, the central processing unit 111 may operate according to firmware provided for various operations of the data storage device 10. In an embodiment, the central processing unit 111 may perform a function of a flash transformation layer FTL for performing garbage collection, address mapping, wear leveling and the like for managing the storage unit 120. In addition, the central processing unit 111 may detect an error of data read from the storage unit 120 and correct the error. The central processing unit 111 may include all circuits, systems, firmware and devices necessary for its operations and functions.

The host interface 113 may provide a communication channel for receiving a command and a clock signal from the host device (a host processor) and controlling data input/output under the control of the central processing unit 111. Particularly, the host interface 113 may provide a physical connection between the host device and the data storage device 10. The host interface 113 may provide interfacing with the data storage device 10 in correspondence with a bus format of the host device. The bus format of the host device may include at least one of standard interface protocols such as a secure digital, a universal serial bus (USB), a multi-media card (MMC), an embedded MMC (eMMC), a personal computer memory card international association (PCMCIA), a parallel advanced technology attachment (DATA), a serial advanced technology attachment (SATA), a small computer system interface (SCSI), a serial attached SCSI (SAS), a peripheral component interconnection (PCI), a PCI express (PCI-E), and a universal flash storage (UFS).

The operation memory 115 may store program codes required for an operation of the controller 110, for example, firmware or software, and store code data used by the program codes.

The buffer manager 117 may be configured to temporarily store, in the buffer memory unit 200, data transmitted/received between the host device and the storage unit 120 in a program or read operation under the control of the central processing unit 111.

The buffer memory unit 200 may include a volatile or nonvolatile memory. In an embodiment, a plurality of buffer memories units 200 may include a SRAM and/or a DRAM; however, the embodiment is not limited thereto.

The memory interface 119 may provide a communication channel for signal transmission/reception between the controller 110 and the storage unit 120. The memory interface 119 may write the data temporarily stored in the buffer memory unit 200 in the storage unit 120 under the control of the central processing unit 111. Furthermore, the memory interface 119 may transfer data read from the storage unit 120 to the buffer memory unit 200 for temporal storage.

The read control unit 20 may determine disturbance risk for each block of the storage unit 120, which is accessed in response to a read request of the host, according to a prescribed reference. The read control unit 20 may maintain data, which has been read from a block determined as the disturbance risk block, in the buffer memory unit 200, and control read access for the disturbance risk block not to be performed. The read data read from the disturbance risk block and stored in the buffer memory unit 200 may be transferred to an empty block or an open block of the storage unit 120 under the control of the read control unit 20 when the data storage device 10, for example, is in an idle state.

Figure 3:
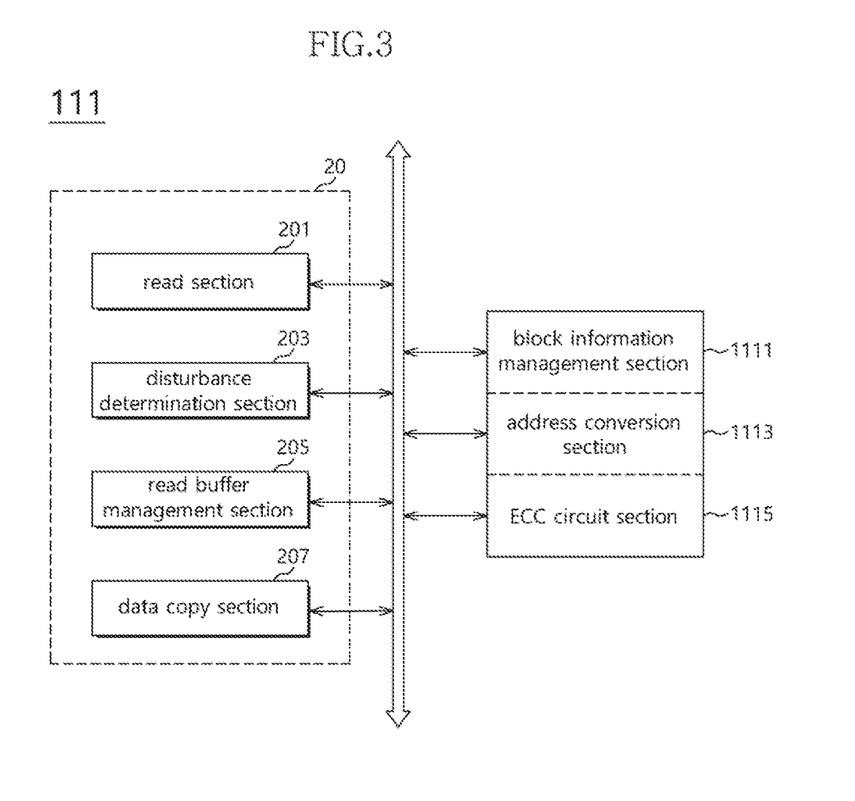
FIG. 3 is a configuration diagram of a controller including a read control unit in accordance with an embodiment.

FIG. 3 is a configuration diagram of the controller 110 including the read control unit 20 in accordance with an embodiment.

Referring to FIG. 3, the central processing unit 111 may include the read control unit 20, a block information management section 1111, an address conversion section 1113, and an error correction code (ECC) circuit section 1115.

The block information management section 1111 may store and manage information on each of a plurality of blocks constituting the storage unit 120. The information on each of a plurality of blocks may include information including a block identifier, a block attribute, the number of effective pages, a page offset, the number of times read, an error bit number and the like.

In an embodiment, the block attribute of a block may indicate that the corresponding block is an open block, a closed block, or a disturbance risk block; however, the embodiment is not limited thereto. The open block may indicate a memory block currently being used for processing a write request. The closed block may be a block having no empty space capable of storing data or a block set such that data is not stored. The disturbance risk block may indicate a block in which a disturbance risk degree exceeds a threshold value due to repeated read access. A block determined as the disturbance risk block by a disturbance determination section 203 to be described later may have attributes of the disturbance risk block.

The address conversion section 1113 may store and manage a relation between logic addresses managed by the host device and physical spaces of the storage unit 120 in the form of an address mapping table.

In an embodiment, the address conversion section 1113 may store substitute access information for the block determined as the disturbance risk block. In an embodiment, read data of the disturbance risk block may be maintained in the buffer memory unit 200, and the address conversion section 1113 may store a physical address of the storage location, in which the read data of the disturbance risk block has been stored in the buffer memory unit 200, as substitute access information. In an embodiment, read data read from the disturbance risk block and stored in the buffer memory unit 200 may be moved to an empty space of the storage unit 120 in a specific situation defined in advance. Then, the address conversion section 1113 may manage address mapping information for a storage location of the read data moved from the buffer memory unit 200 to the empty space of the storage unit 120.

The ECC circuit section 1115 may detect an error of data read from the storage unit 120. When the detected error is in a correction range, the ECC circuit section 1115 may correct the detected error. In an embodiment, the ECC circuit section 1115 may provide the block information management section 1111 with a number of read-error bits in each block to store the number of read-error bits.

The read control unit 20 may include a read section 201, the disturbance determination section 203, a read buffer management section 205, and a data copy section 207.

The read section 201 may perform a read operation in response to a read request from the host device and address information. To this end, the read section 201 may be configured to read data from a location of the storage unit 120 or the buffer memory unit 200 based on access information provided from the address conversion section 1113. In an embodiment, the access information provided by the address conversion section 1113 may be a physical block address of the storage unit 120 or a physical address of the buffer memory unit 200.

In an embodiment, the address conversion section 1113 may provide a physical block address of the storage unit 120, which corresponds to a logical address provided by the host device, as access information in response to a request of the host device when a block requested to be read does not have attributes of the disturbance risk block as a result of reference to the block information management section 1111. However, when the block requested to be read has the attributes of the disturbance risk block, the address conversion section 1113 may store a physical block address of the buffer memory unit 200, which corresponds to a logical block address provided by the host device, as substitute access information.

Data read from the storage unit 120 accessed by the read section 201 according to the access information provided by the address conversion section 1113 may be primarily stored in the buffer memory unit 200. When the read section 201 accesses the storage unit 120 and performs a read operation, the read section 201 may update information on the number of times read for a corresponding block stored in the block information management section 1111. In addition, the read section 201 may provide the read buffer management section 205 with a physical block address of the buffer memory unit 200 temporarily storing the data read from the storage unit 120.

When an area to be accessed according to a read request of the host device is not the storage unit 120 but the buffer memory unit 200, the read section 201 may provide the read buffer management section 205 with the substitute access information, that is, the physical address of the buffer memory unit 200, in a location of which the read data of the disturbance risk block is stored.

The disturbance determination section 203 may be configured to determine disturbance risk for a block to be accessed for a read operation based on a prescribed reference in a read operation of the read section 201.

In an embodiment, the disturbance determination section 203 may determine the disturbance risk with reference to at least one of the information on the number of times read for each block and the information on an error bit number stored in the block information management section 1111. For example, when the information on the number of times when a corresponding block is read exceeds a threshold value set in advance and/or when an error bit number of the corresponding block exceeds the threshold value set in advance, the disturbance determination section 203 may determine the corresponding block as a disturbance risk block. The determination results of the disturbance determination section 203 may be reflected in block attributes of the block information management section 1111.

The read buffer management section 205 may be configured to control the buffer memory unit 200 storing the read data, based on the disturbance risk determination results of the disturbance determination section 203.

In an embodiment, when a block accessed for a read operation is a block having low disturbance risk (i.e., when the block is not a disturbance risk block), the read buffer management section 205 may provide the host device with the read data stored in the buffer memory unit 200 on the basis of the physical address of the buffer memory unit 200 storing the read data, and delete the read data from the buffer memory unit 200.

In an embodiment, when the block accessed in the read operation is the disturbance risk block, the read buffer management section 205 may provide the host device with the read data stored in the buffer memory unit 200 on the basis of the physical address of the buffer memory unit 200 storing the read data, and maintaining the read data in the corresponding buffer.

The data copy section 207 may be configured to move the read data of the disturbance risk block maintained in the buffer memory unit 200 to an empty space of the storage unit 120 for storage when the data storage device 10 is transitioned to a specific state, for example, an idle state. Then, the address conversion section 1113 may change address mapping information on the storage location of the read data moved to the empty space of the storage unit 120 from the buffer memory unit 200.

As described above, the read data of the disturbance risk block is maintained in the buffer memory unit under the control of the read section 201, and then a read request for the disturbance risk block is processed through the buffer memory unit, so that it is possible to prevent a read operation from being performed for the disturbance risk block.

Figure 4:
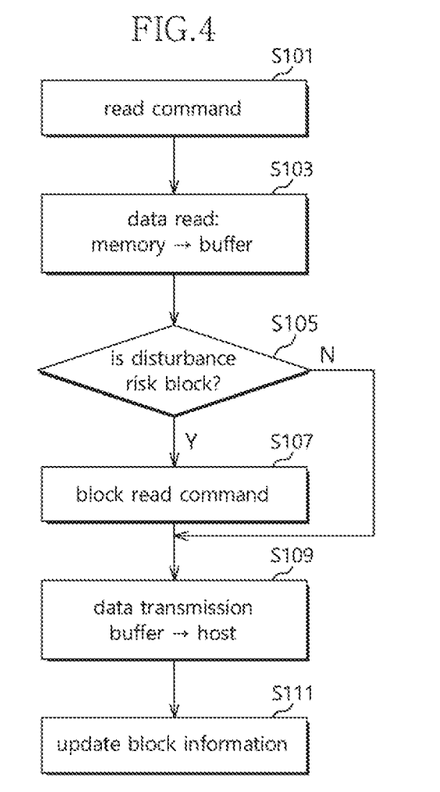
FIG. 4 is a flowchart for a method for preventing read disturbance of a data storage device in accordance with an embodiment.

FIG. 4 is a flowchart for an operation method for the data storage device in accordance with an embodiment.

Referring to FIG. 4, a read request and a logical block address to be accessed for read may be transmitted from the host device at step S101.

Accordingly, the read control unit 20 may receive a physical block address of a read target block from the address conversion section 1113, access an area corresponding to the physical block address in the storage unit 120, and store read data in the buffer memory unit 200 at step S103.

In this case, the read control unit 20 may determine whether the read target block is a disturbance risk block based on information on the number of times the read target block is read and an error bit number among attribute information on the read target block accessed for read at step S105.

As a result of the determination, when the read target block is the disturbance risk block ("Y" at step S105), the read control unit 20 may control a subsequent read access for the read target block to be blocked at step S107.

In an embodiment, in order to block a subsequent access for a block determined as the disturbance risk block, in a state of maintaining read data from the read target block in the buffer memory unit 200, the read control unit 20 may map access information corresponding to a logical block address of the read target block to a physical address of the buffer memory unit 200 storing the read data.

After read access to the disturbance risk block is blocked through step S107 or when it is determined that the read target block is not the disturbance risk block as the determination result of step S105 ("N" at step S105), the read data stored in the buffer memory unit 200 may be transmitted to the host device at step S109.

Then, when it is necessary to change attributes of the block accessed for read, the block information may be updated at step S111.

In an embodiment, the attribute information updated in step S111 may include the number of times read for the read target block and a bit number of an error occurring in the read. In the case of the block determined as the disturbance risk block as the determination result of step S105, the block attribute information may include information indicating that the block is the disturbance risk block.

Figure 5:
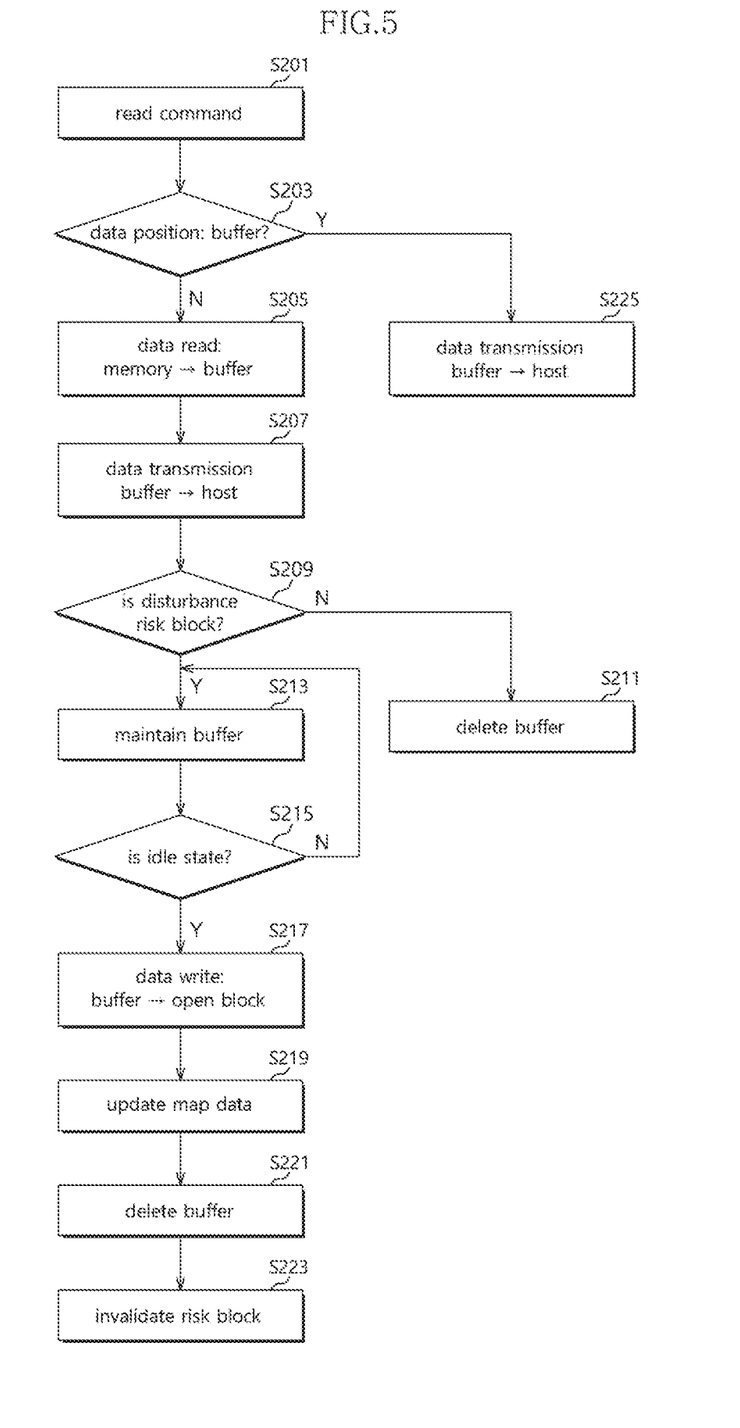
FIG. 5 is a flowchart for a method for preventing read disturbance of a data storage device in accordance with an embodiment.

FIG. 5 is a flowchart for a method for preventing read disturbance of the data storage device in accordance with an embodiment.

Referring to FIG. 5, a read request and a logical block address to be accessed for read may be transmitted from the host device at step S201.

The read control unit 20 may receive access information from the address conversion section 1113 based on the logical block address. The read control unit 20 may determine a data storage location according to the access information at step S203.

When the data storage location is not the buffer memory unit 200 but the storage unit 120, the read control unit 20 may read data from a corresponding physical space of the storage unit 120 and store the read data in the buffer memory unit 200 at step S205. An error of the data read from the storage unit 120 may be detected and corrected by the ECC circuit section. Then, block attribute information according to the read operation for the storage unit 120 may be updated. In an embodiment, the read control unit 20 may update attribute information on the number of times read for a read target block and an error bit number.

The read control unit 20 may transfer the read data stored in the buffer memory unit 200 to the host device at step S207, and determine disturbance risk for the read target block based on a prescribed reference at step S209. In an embodiment, the read control unit 20 may determine the disturbance risk based on the attribute information including the number of times read for the read target block and the error bit number.

When it is determined that the disturbance risk is low ("N" at step S209), the read control unit 20 may delete the read data from the buffer memory unit 200 at step S211.

When it is determined that the read target block is a disturbance risk block ("Y" at step S209), the read control unit 20 may maintain the read data in the buffer memory unit 200 at step S213.

Accordingly, when a read request for the disturbance risk block is triggered again at step S201, the read control unit 20 may confirm that access information on the read target block indicates the buffer memory unit 200 and transmit the data of the buffer memory unit 200 to the host device at step S225.

Furthermore, the read control unit 20 may monitor whether the data storage device 10 is transitioned to an idle state at step S215. When the data storage device 10 is transitioned to the idle state ("Y" at step S215), the read control unit 20 may move the read data maintained in the buffer memory unit 200 to an empty space of the storage unit 120 for safe storage at step S217.

As the data of the disturbance risk block is moved to another space of the storage unit 120, the read control unit 20 may update an address mapping table between read target blocks at step S219. In addition, the read control unit 20 may delete the read data of the buffer memory unit 200 at step S221 and invalidate data of the disturbance risk block at step S223.

Figure 6:
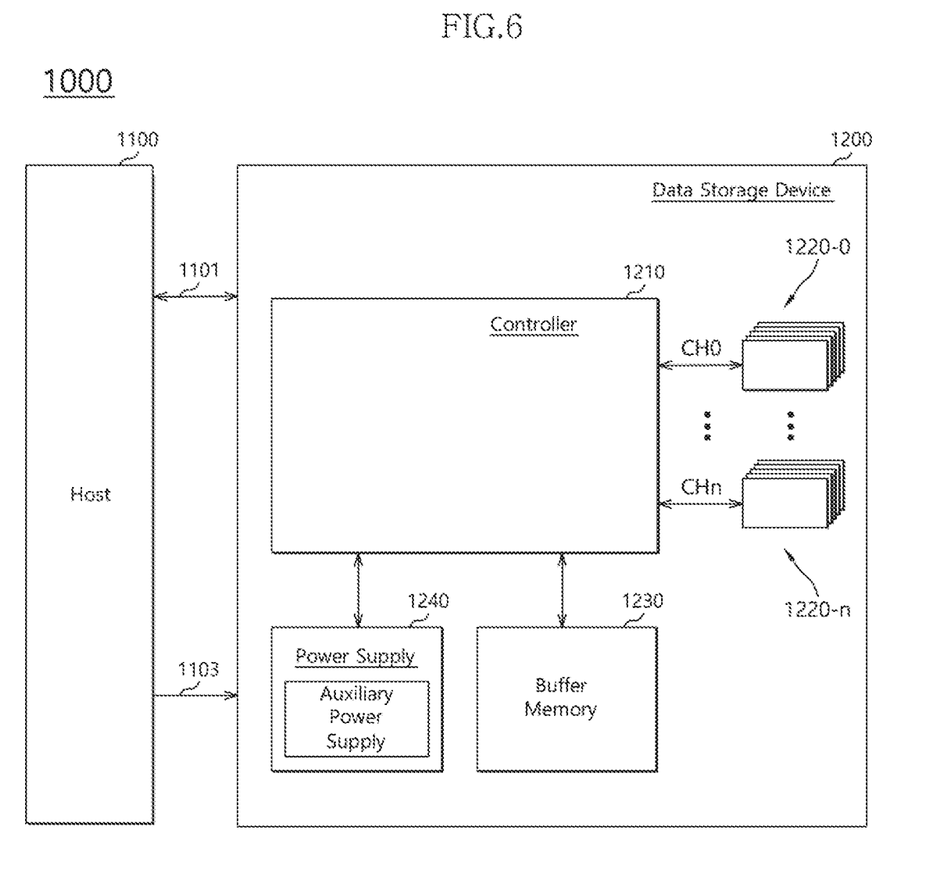
FIG. 6 is a diagram illustrating of a storage system in accordance with an embodiment.

FIG. 6 is a diagram illustrating a data storage system in accordance with an embodiment.

Referring to FIG. 6, the data storage 1000 may include a host device 1100 and the data storage device 1200. In an embodiment, the data storage device 1200 may be configured to a solid state drive (SSD).

The data storage device 1200 may include a controller 1210, a plurality of nonvolatile memory devices 1220-0 to 1220-n, a buffer memory device 1230, a power supply 1240, a signal connector 1101, and a power connector 1103.

The controller 1210 may control general operations of the data storage device 1200. The controller 1210 may include a host interface unit, a control unit, a random access memory used as a working memory, an error correction code (ECC) unit, and a memory interface unit. In an embodiment, the controller 1210 may be configured by controller 110 comprising the read control unit 20 as shown is FIG. 1 to FIG. 3.

The host device 1100 may exchange a signal with the data storage device 1200 through the signal connector 1101. The signal may include a command, an address, data, and so forth.

The controller 1210 may analyze and process the signal received from the host device 1100. The controller 1210 may control operations of internal function blocks according to a firmware or a software for driving the data storage device 1200.

The buffer memory device 1230 may temporarily store data to be stored in at least one of the nonvolatile memory devices 1220-0 to 1220-n. Further, the buffer memory device 1230 may temporarily store the data read from at least one of the nonvolatile memory devices 1220-0 to 1220-n. The data temporarily stored in the buffer memory device 1230 may be transmitted to the host device 1100 or at least one of the nonvolatile memory devices 1220-0 to 1220-n according to control of the controller 1210.

The nonvolatile memory devices 1220-0 to 1220-n may be used as storage media of the data storage device 1200. The nonvolatile memory devices 1220-0 to 1220-n may be coupled with the controller 1210 through a plurality of channels CH1 to CHn, respectively. One or more nonvolatile memory devices may be coupled to one channel. The nonvolatile memory devices coupled to each channel may be coupled to the same signal bus and data bus.

The power supply 1240 may provide power inputted through the power connector 1103, to the inside of the data storage device 1200. The power supply 1240 may include an auxiliary power supply. The auxiliary power supply may supply power to allow the data storage device 1200 to be normally terminated when a sudden power-off occurs. The auxiliary power supply may include large capacity capacitors.

The signal connector 1101 may be configured by various types of connectors depending on an interface scheme between the host device 1100 and the data storage device 1200.

The power connector 1103 may be configured by various types of connectors depending on a power supply scheme of the host device 1100.

Figure 7:
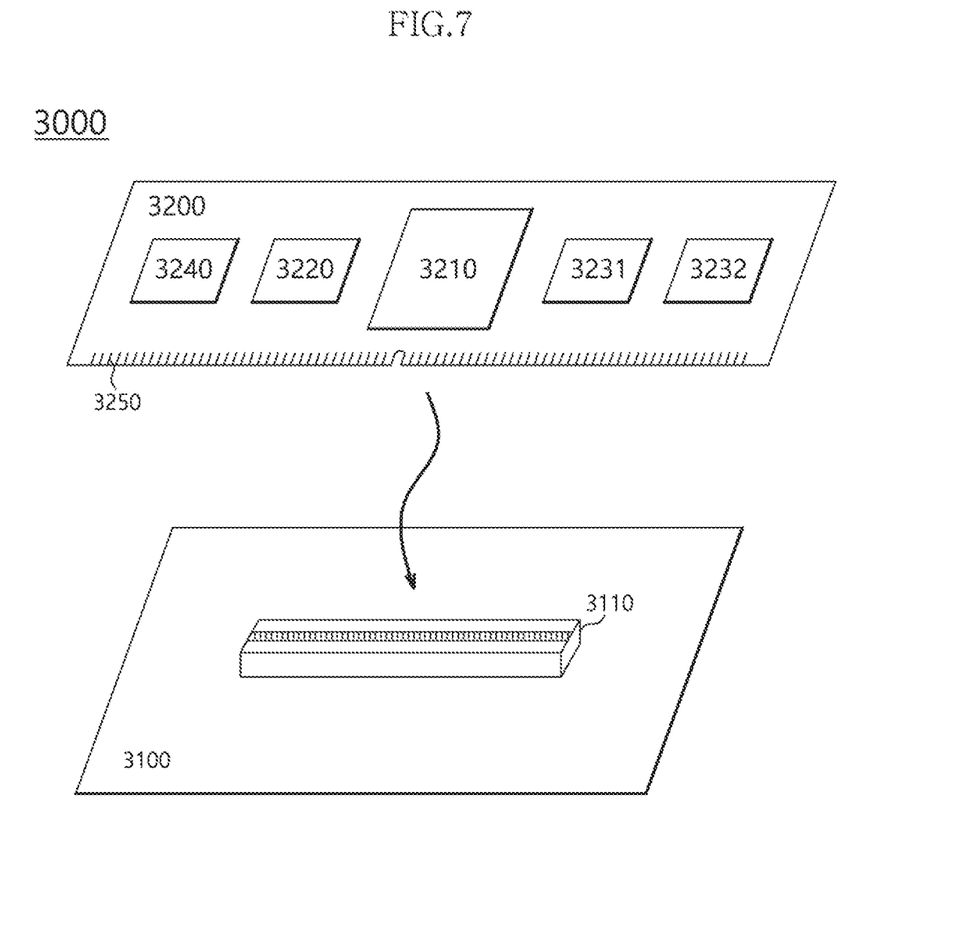
FIG. 7 and FIG. 8 are diagrams illustrating a data processing system in accordance with embodiments.

FIG. 7 is a diagram illustrating a data processing system in accordance with an embodiment. Referring to FIG. 7, the data processing system 3000 may include a host device 3100 and the memory system 3200.

The host device 3100 may be configured in the form of a board such as a printed circuit board. Although not shown, the host device 3100 may include internal function blocks for performing the function of a host device.

The host device 3100 may include a connection terminal 3110 such as a socket, a slot or a connector. The memory system 3200 may be mounted to the connection terminal 3110.

The memory system 3200 may be configured in the form of a board such as a printed circuit board. The memory system 3200 may be referred to as a memory module or a memory card. The memory system 3200 may include a controller 3210, a buffer memory device 3220, nonvolatile memory devices 3231 and 3232, a power management integrated circuit (PMIC) 3240, and a connection terminal 3250.

The controller 3210 may control general operations of the memory system 3200. The controller 3210 may be configured in the same manner as the controller 110 comprising the read control unit 20 as shown in FIGS. 1 to 3.

The buffer memory device 3220 may temporarily store data in the nonvolatile memory devices 3231 and 3232. Further, the buffer memory device 3220 may temporarily store the data read from the nonvolatile memory devices 3231 and 3232. The data temporarily stored in the buffer memory device 3220 may be transmitted to the host device 3100 or the nonvolatile memory devices 3231 and 3232 according to control of the controller 3210.

The nonvolatile memory devices 3231 and 3232 may be used as storage media of the memory system 3200.

The PMIC 3240 may provide the power inputted through the connection terminal 3250, to the inside of the memory system 3200. The PMIC 3240 may manage the power of the memory system 3200 according to control of the controller 3210.

The connection terminal 3250 may be coupled to the connection terminal 3110 of the host device 3100. Through the connection terminal 3250, signals such as commands, addresses, data and so forth, and power may be transferred between the host device 3100 and the memory system 3200. The connection terminal 3250 may be configured into various types depending on an interface scheme between the host device 3100 and the memory system 3200. The connection terminal 3250 may be disposed on any one side of the memory system 3200.

Figure 8:
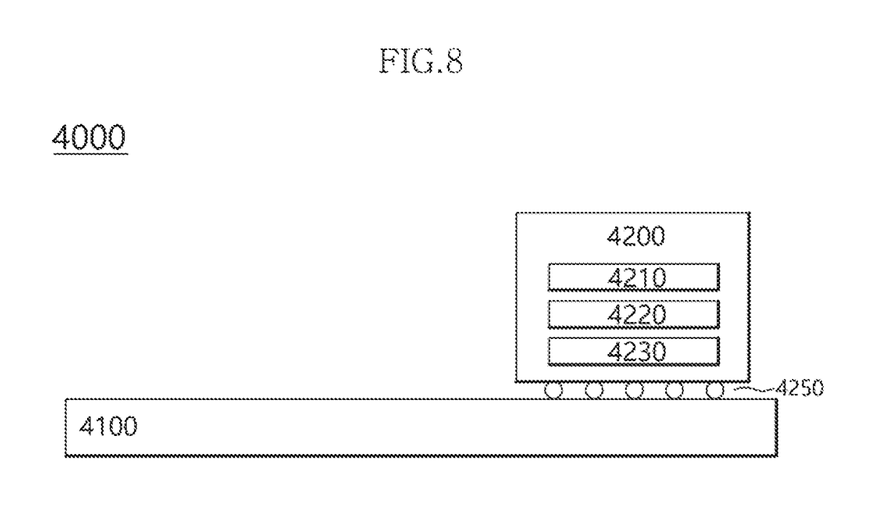

FIG. 8 is a diagram illustrating a data processing system in accordance with an embodiment. Referring to FIG. 8, the data processing system 4000 may include a host device 4100 and the memory system 4200.

The host device 4100 may be configured in the form of a board such as a printed circuit board. Although not shown, the host device 4100 may include internal function blocks for performing the function of a host device.

The memory system 4200 may be configured in the form of a surface-mounting type package. The memory system 4200 may be mounted to the host device 4100 through solder balls 4250. The memory system 4200 may include a controller 4210, a buffer memory device 4220, and a nonvolatile memory device 4230.

The controller 4210 may control general operations of the memory system 4200. The controller 4210 may be configured in the same manner as the controller 110 comprising the read control unit 20 as shown in FIGS. 1 to 3.

The buffer memory device 4220 may temporarily store data in the nonvolatile memory device 4230. Further, the buffer memory device 4220 may temporarily store the data read from the nonvolatile memory device 4230. The data temporarily stored in the buffer memory device 4220 may be transmitted to the host device 4100 or the nonvolatile memory device 4230 according to control of the controller 4210.

The nonvolatile memory device 4230 may be used as the storage medium of the memory system 4200.

Figure 9:
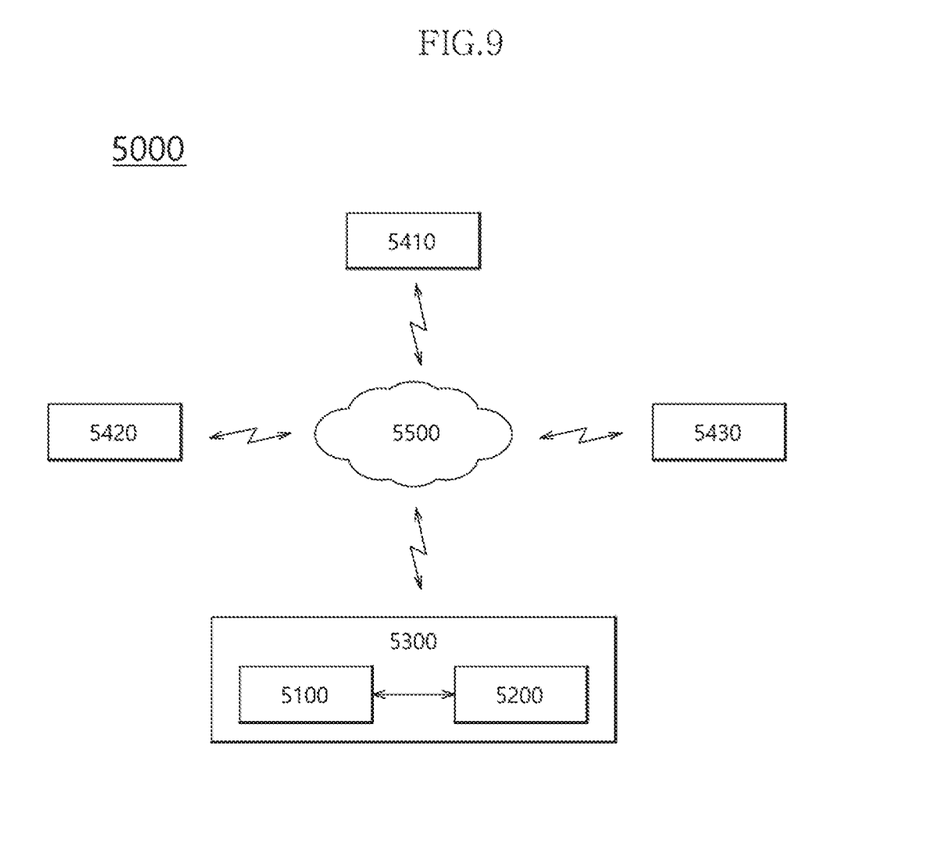
FIG. 9 is a diagram illustrating a network system including a data storage device in accordance with an embodiment.

FIG. 9 is a diagram illustrating a network system including a data storage device in accordance with an embodiment. Referring to FIG. 9, the network system 5000 may include a server system 5300 and a plurality of client systems 5410 to 5430 which are coupled through a network 5500.

The server system 5300 may service data in response to requests from the plurality of client systems 5410 to 5430. For example, the server system 5300 may store the data provided from the plurality of client systems 5410 to 5430. For another example, the server system 5300 may provide data to the plurality of client systems 5410 to 5430.

The server system 5300 may include a host device 5100 and the memory system 5200. The memory system 5200 may be configured by the memory system 10 shown in FIG. the data storage device 1200 shown in FIG. 6, the memory system 3200 shown in FIG. 7 or the memory system 4200 shown in FIG. 8.

Figure 10:
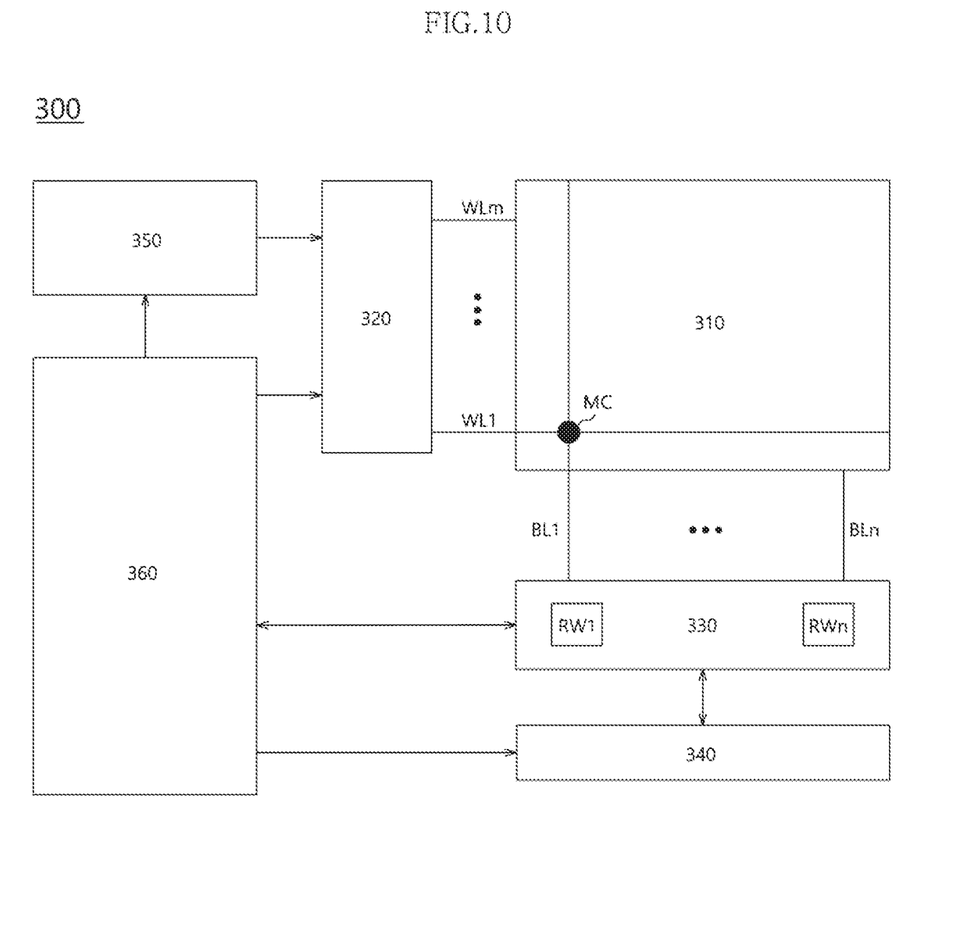
FIG. 10 is a diagram illustrating a nonvolatile memory device included in a data storage device in accordance with an embodiment.

FIG. 10 is a block diagram illustrating a nonvolatile memory device included in a data storage device in accordance with an embodiment. Referring to FIG. 10, the nonvolatile memory device 300 may include a memory cell array 310, a row decoder 320, a data read/write block 330, a column decoder 340, a voltage generator 350, and a control logic 360.

The memory cell array 310 may include memory cells MC which are arranged at areas where word lines WL1 to WLm and bit lines BL1 to BLn intersect with each other.

The memory cell array 310 may comprise a three-dimensional memory array. The three-dimensional memory array has a direction perpendicular to the flat surface of a semiconductor substrate. Moreover, the three-dimensional memory array means a structure including NAND strings in which at least one memory cell is located in a vertical upper portion of the other memory cell.

The structure of the three-dimensional memory array is not limited thereto. It is apparent that the memory array structure can be selectively applied to a memory array structure formed in a highly integrated manner with horizontal directionality as well as vertical directionality.

The row decoder 320 may be coupled with the memory cell array 310 through the word lines WL1 to WLm. The row decoder 320 may operate according to control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 330 may be coupled with the memory cell array 310 through the bit lines BL1 to BLn. The data read/write block 330 may include read/write circuits RW1 to RWn respectively corresponding to the bit lines BL1 to BLn. The data read/write block 330 may operate according to control of the control logic 360. The data read/write block 330 may operate as a write driver or a sense amplifier according to an operation mode. For example, the data read/write block 330 may operate as a write driver which stores data provided from the external device, in the memory cell array 310 in a write operation. For another example, the data read/write block 330 may operate as a sense amplifier which reads out data from the memory cell array 310 in a read operation.

The column decoder 340 may operate according to control of the control logic 360. The column decoder 340 may decode an address provided from the external device. The column decoder 340 may couple the read/write circuits RW1 to RWn of the data read/write block 330 respectively corresponding to the bit lines BL1 to BLn with data input/output lines or data input/output buffers, based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the nonvolatile memory device 300, based on control signals provided from the external device. For example, the control logic 360 may control operations of the nonvolatile memory device 300 such as read, write and erase operations of the nonvolatile memory device 300.

While various embodiments have been described above, it will be understood to those skilled in the art that the embodiments described are examples only. Accordingly, the data storage device, the operating method thereof and the storage system including the same described herein should not be limited based on the described embodiments.

What is claimed is:

1. A memory system comprising:
    a storage unit configured to include a plurality of memory blocks;
    a controller configured to read data from the memory block, and to determine disturbance risk for the memory block; and
    a buffer memory unit configured to store the data read from the memory block and to provide the data to a host,
    wherein the controller is configured to control the buffer memory unit, in which the data read from the memory block is stored, based on the disturbance risk for the memory block.

2. The memory system according to claim 1, wherein the controller is configured to determine the disturbance risk for the memory block when the data is read from the memory block.

3. The memory system according to claim 1, wherein the controller is configured to control the buffer memory unit, in which the data is stored, based on the disturbance risk for the memory block to keep the data until the data is copied to another memory block.

4. The memory system according to claim 3, wherein the controller is configured to invalidate the memory block determined as a disturbance risk block after the data is copied to the another memory block.

5. The memory system according to claim 3, wherein the disturbance risk for the memory block is determined based on a number of times each of the plurality of blocks is read, and a bit number of an error occurring when the data is read from the memory block.

6. The memory system according to claim 3, wherein the controller is configured to, after storing the data read from the memory block determined as a disturbance risk block to the buffer memory, read the data from the buffer memory unit and to provide to the host, without accessing the disturbance risk block in response to a read command received from host to read the data.

7. An operating method of a memory system including a storage unit having a plurality of memory blocks, a controller and a buffer memory unit, comprising:
    determining a disturbance risk for a memory block, when data is read from the memory block;
    storing the data, read from the memory block, in the buffer memory unit;
    controlling the buffer memory unit, in which the data is stored, based on the determination of the disturbance risk for the memory block; and
    copying the data, stored in the buffer memory unit, to another memory block and invalidating the memory block, when the memory block is determined as a disturbance risk block.

8. The method according to claim 7, wherein the disturbance risk for the memory block is determined based on a number of times each of the plurality of blocks is read, and a bit number of an error occurring when the data is read from the memory block.

9. A memory system, comprising:
a storage unit configured to include a plurality of memory blocks;
a controller configured to read data from the memory block, and to determine disturbance risk for the memory block; and
a buffer memory unit configured to store the data read from the memory block and to provide the data to a host,
wherein the controller is configured to control the buffer memory unit to keep the data based on the disturbance risk for the memory block.

10. The memory system according to claim 9, wherein the controller is configured to release the buffer memory unit in which the data is stored, after the data is copied to another memory block.

11. The memory system according to claim 9, wherein the disturbance risk for the memory block is determined based on a number of times each of the plurality of blocks is read, and a bit number of an error occurring when the data is read from the memory block.

12. The memory system according to claim 9, wherein the controller is configured to, after storing the data read from the memory block determined as a disturbance risk block to the buffer memory, read the data from the buffer memory unit and to provide to the host, without accessing the disturbance risk block in response to a read command received from host to read the data.

13. An operating method of a memory system including a storage unit having a plurality of memory blocks, a controller and a buffer memory unit, comprising:
reading data from a memory block;
determining a disturbance risk for the memory block;
storing the data, read from the memory block, in a buffer memory unit; and
determining whether releasing the buffer memory unit in which the data is stored or keeping the data in the buffer memory unit, based on the determination of the disturbance risk for the memory block.

14. The operating method according claim 13, further comprising:
keeping the data in the buffer memory unit, in which the data is stored, until the data is copied to another memory block when the memory block is determined as a disturbance risk block.

15. The operating method according claim 13, further comprising:
releasing the buffer memory unit after the data, stored in the buffer memory unit, is copied to the another memory block.

16. The operating method according claim 13, wherein the disturbance risk for the memory block is determined based on a number of times each of the plurality of blocks is read, and a bit number of an error occurring when the data is read from the memory block.

17. The operating method according claim 13, further comprising:
read the data by accessing the buffer memory unit without accessing the memory block which is determined as a disturbance risk block in response to a read command received from host to read the data; and
providing the data to the host.

* * * * *